United States Patent
Lee et al.

(10) Patent No.: US 9,847,780 B2
(45) Date of Patent: Dec. 19, 2017

(54) POWER-UP SIGNAL GENERATION CIRCUIT AND SEMICONDUCTOR DEVICE INCLUDING THE SAME

(71) Applicant: SK hynix Inc., Gyeonggi-do (KR)

(72) Inventors: Kyoung-Youn Lee, Gyeonggi-do (KR); Sang-Ho Lee, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 235 days.

(21) Appl. No.: 14/488,043

(22) Filed: Sep. 16, 2014

(65) Prior Publication Data
US 2015/0311885 A1    Oct. 29, 2015

(30) Foreign Application Priority Data
Apr. 28, 2014   (KR) .......................... 10-2014-0050785

(51) Int. Cl.
| | |
|---|---|
| H03K 17/22 | (2006.01) |
| G06F 1/24 | (2006.01) |
| G06F 1/26 | (2006.01) |
| H03K 3/356 | (2006.01) |

(52) U.S. Cl.
CPC ............. *H03K 17/223* (2013.01); *G06F 1/24* (2013.01); *G06F 1/26* (2013.01); *H03K 3/356104* (2013.01)

(58) Field of Classification Search
CPC .................................................. H03K 17/233
USPC ......................................................... 713/323
See application file for complete search history.

(56) References Cited

U.S. PATENT DOCUMENTS

| | | | | |
|---|---|---|---|---|
| 2005/0083751 A1* | 4/2005 | Fujiu | ................... | H03K 17/223 |
| | | | | 365/222 |
| 2008/0018381 A1* | 1/2008 | Shin | ....................... | G11O 5/145 |
| | | | | 327/536 |
| 2008/0052547 A1* | 2/2008 | Min | ........................ | G11O 5/14 |
| | | | | 713/300 |
| 2008/0288803 A1* | 11/2008 | Edamoto | .................. | G06F 1/30 |
| | | | | 713/340 |
| 2010/0131694 A1* | 5/2010 | Kelly | ................. | G06F 12/0246 |
| | | | | 711/102 |

(Continued)

FOREIGN PATENT DOCUMENTS

| | | |
|---|---|---|
| KR | 1020060054612 | 5/2006 |
| KR | 1020100002864 | 1/2010 |
| KR | 1020100026204 | 3/2010 |

*Primary Examiner* — Ji H Bae
*Assistant Examiner* — Sumil Desai
(74) *Attorney, Agent, or Firm* — IP & T Group LLP

(57) ABSTRACT

A power-up signal generation circuit including a pre-power-up signal generation block operates by using a first power supply voltage, and generates a pre-power-up signal when the first power supply voltage becomes higher than a first level, and a second power supply voltage becomes higher than a second level; a level shifting block suitable for pull-down driving a first node when the pre-power-up signal is not in an activated state, and pull-up driving the first node with the second power supply voltage when the pre-power-up signal is in the activated state; a driving block suitable for pull-down driving the first node when the second power supply voltage is lower than the second level; and a power-up signal driving block operates by using the second power supply voltage, and generates a power-up signal through a second node by driving the second node based on a voltage level of the first node.

9 Claims, 7 Drawing Sheets

(56) References Cited

U.S. PATENT DOCUMENTS

2011/0095814 A1*  4/2011  Kim .................. G11O 5/14
                                                327/538
2015/0153815 A1*  6/2015  Ito .................. G06F 1/3287
                                                713/323

* cited by examiner

POWER-UP SIGNAL GENERATION CIRCUIT AND SEMICONDUCTOR DEVICE INCLUDING THE SAME

CROSS-REFERENCE TO RELATED APPLICATIONS

The present application claims priority of Korean Patent Application No. 10-2014-0050785, filed on Apr. 28, 2014, which is incorporated herein by reference in its entirety.

BACKGROUND

1. Field

Various embodiments of the present invention relate to a power-up signal generation circuit and a semiconductor device including the same.

2. Description of the Related Art

In general, in a semiconductor device, a power-up signal generation circuit generates a power-up signal that initializes the semiconductor device. During operation, the semiconductor device receives a power supply voltage (VDD) through a voltage pad from an exterior. The level of the power supply voltage (VDD) supplied through the voltage pad rises from a predetermined voltage, for example, a ground voltage, to a target level with a predetermined slope.

The internal circuit of the semiconductor device performs various operations by using the power supply voltage (VDD). When the power supply voltage (VDD) is used for the operations before it has been stabilized, a concern may occur, such as, a latch-up phenomenon. Thus, the reliability of the semiconductor device may not be guaranteed. In addition, if the internal circuit has not been initialized when the operation of the internal circuit is started, since the signals generated in the internal circuit have uncertain values, an operation error of the semiconductor device is likely to occur.

Therefore, to improve the reliability of the semiconductor device and to prevent an error from occurring in the initial operation of the semiconductor device, the semiconductor device detects the level of the power supply voltage (VDD), which is inputted from the exterior, and allows the power supply voltage (VDD) to be supplied to the internal circuit when the level of the power supply voltage (VDD) rises higher than a predetermined level and is thus stabilized. Further, the semiconductor device initializes the internal circuit before the operation of the internal circuit is started.

A power-up signal is activated when the level of the power supply voltage (VDD) reaches the predetermined level, that is the power-up signal is deactivated until the level of the power supply voltage (VDD) reaches the predetermined level. Thus, the power supply voltage (VDD) may be prevented from being supplied to the internal circuit while it is not stabilized, to protect the internal circuit, and the internal circuit may be initialized before the operation of the semiconductor device is started, to prevent the malfunction of the semiconductor device.

As various kinds of external power supply voltages are used in a semiconductor device, a need for a power-up signal that stably initializes an internal circuit while allowing power supply voltages to be stably supplied to the internal circuit of the semiconductor device, even when speeds at which the levels of the respective power supply voltages rise are different, or an order in which the levels of the respective power supply voltages rise is changed.

SUMMARY

Various embodiments of the present invention are directed to a power-up signal generation circuit that may generate a power-up signal such that the supply of power and the initialization of an internal circuit are stably performed regardless of the order in which the levels of respective power supply voltages rise, when a semiconductor device operates using two or more power supply voltages, and a semiconductor device including the same.

In an embodiment of the present invention, a power-up signal generation circuit may include: a pre-power-up signal generation block suitable for operating by using a first power supply voltage with a first target level, and generating a pre-power-up signal activated when the first power supply voltage becomes higher than a first level and a second power supply voltage with a second target level higher than the first target level becomes higher than a second level; a level shifting block suitable for pull-down driving an first node when the pre-power-up signal is not in an activated state, and pull-up driving the first node with the second power supply voltage when the pre-power-up signal is in the activated state; an additional driving block suitable for pull-down driving the first node when the second power supply voltage is lower than the second level; and a power-up signal driving block suitable for operating by using the second power supply voltage, and generating a power-up signal through a second node by driving the second node based on a voltage level of the first node.

In an embodiment of the present invention, a power-up signal generation circuit may include: a pre-power-up signal generation block suitable for operating by using a first power supply voltage with a first target level, and generating a pre-power-up signal activated when the first power supply voltage becomes higher than a first level, and a second power supply voltage which has a second target level higher than the first target level and becomes higher than a second level; a level shifting block suitable for pull-down driving a first node when the pre-power-up signal is not in an activated state, and pull-up driving the first node with the second power supply voltage when the pre-power-up signal is in the activated state; an additional driving block suitable for pull-down driving the first node when the second power supply voltage is lower than the second level; and a power-up signal driving block suitable for operating by using the second power supply voltage, and generating a power-up signal through a second node by driving the second node based on a voltage level of the first node, wherein, when the voltage of the first node is a high level, the power-up signal driving block drives the second node with a negative voltage lower than a ground voltage.

In an embodiment of the present invention, a semiconductor device may include: a first power pad suitable for receiving a first power supply voltage with a first target level; a second power pad suitable for receiving a second power supply voltage with a second target level higher than the first target level; a first power-up signal generation block suitable for operating by using the first power supply voltage received through the first power pad, and generating a first power-up signal activated when the first power supply voltage becomes higher than a first level and the second power supply voltage received through the second power pad becomes higher than a second level; a second power-up signal generation block suitable for generating a second power-up signal by shifting a level of the first power-up signal, and deactivating the second power-up signal when the second power supply voltage is lower than the second level; and an internal circuit suitable for operating by using the first power supply voltage and the second power supply voltage, and being initialized based on the first power-up signal and the second power-up signal.

DETAILED DESCRIPTION

Figure 1:
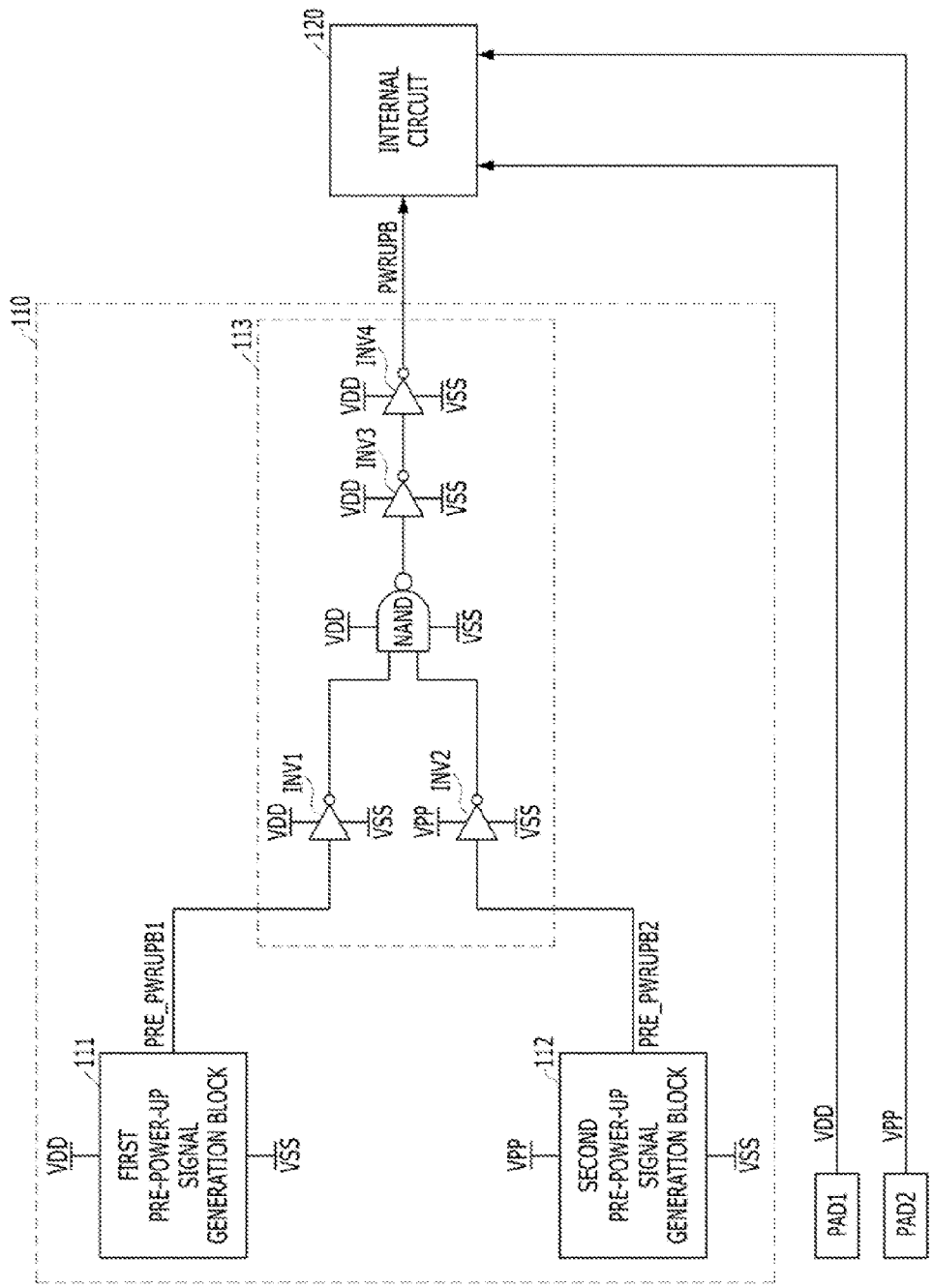
FIG. 1 is a diagram illustrating a semiconductor device including a power-up signal generation circuit.

Various embodiments of the present invention will be described below in more detail with reference to the accompanying drawings. The present, invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

In the drawings, for convenience of illustration thicknesses, widths and lengths of components are exaggerated compared to actual physical thicknesses, widths and lengths. In the following description, a detailed description of known related functions and constitutions may be omitted to avoid unnecessarily obscuring the subject manner of the present invention. Furthermore, "connected/coupled" represents that one component is directly coupled to another component or indirectly coupled through another component. In this specification, a singular form may include a plural form as long as it is not specifically mentioned in a sentence. Furthermore, "include/comprise" or "including/comprising" used in the specification represents that one or more components, steps, operations and elements exist, or are added.

FIG. 1 is a diagram illustrating a semiconductor device including a power-up signal generation circuit 110.

As shown in FIG. 1, the semiconductor device may include the power-up signal generation circuit 110, an internal circuit 120 and voltage pads PAD1 and PAD2. The power-up signal generation circuit 110 may include a first pre-power-up signal generation block 111, a second pre-power-up signal generation block 112, and a signal combination block 113.

The first pre-power-up signal generation block 111 operates using a first power supply voltage VDD. The first pre-power-up signal generation block 111 detects the level of the first power supply voltage VDD, and generates a first pre-power-up signal PRE_PWRUPB1 activated when the level of the first power supply voltage VDD becomes higher than a first level. The level of the first power supply voltage VDD, which is inputted from an exterior, may rise with a predetermined slope from a ground voltage VSS, and may reach a first target level past the first level. The first level may represent a minimum level that allows the first power supply voltage VDD to be stably supplied to an internal circuit 120. Also, the first target level may represent a level that the first power supply voltage VDD should finally reach. For a DDR4 DRAM, the first target level may be 1.2V but may be changed according to a design. The first pre-power-up signal PRE_PWRUPB1 is activated to a low level, that is, the first pre-power-up signal PRE_PWRUPB1 has the activation level of the ground voltage VSS. When the first pre-power-up signal PRE_PWRUPB1 is not activated, a node from which the first pre-power-up signal PRE_P-WRUPB1 is generated may be driven by the first power supply voltage VDD.

The second pre-power-up signal generation block 112 operates using a second power supply voltage VPP. The second pre-power-up signal generation block 112 detects the level of the second power supply voltage VPP, and generates a second pre-power-up signal PRE_PWRUPB2 activated when the level of the second power supply voltage VPP becomes higher than a second level. The level of the second power supply voltage VPP, which is inputted from an exterior, may rise with a predetermined slope from the ground voltage VSS, and may reach a second target level past the second level. The second level may represent a minimum level that allows the second power supply voltage VPP to be stably supplied to an internal circuit (not shown). Moreover, the second target level may represent a level that the second power supply voltage VPP should finally reach. For a DDR4 DRAM, the second target level may be 2.5V but may be changed according to a design. The second pre-power-up signal PRE_PWRUPB2 is activated to a low level, that is, the second pre-power-up signal PRE_PWRUPB2 has the activation level of the ground voltage VSS. When the second pre-power-up signal PRE_PWRUPB2 is not activated, a node from which the second pre-power-up signal PRE_PWRUPB2 is generated, may be driven by the second power supply voltage VPP.

The signal combination block 113 operates using the first power supply voltage VDD, and generates a power-up signal PWRUPB activated when the first pre-power-up signal PRE_PWRUPB1 and the second pre-power-up signal PRE_PWRUPB2 are activated. The signal combination block 113 may include a plurality of drivers INV1 to INV4 and a NAND gate NAND. Each of the drivers INV1 to INV4 may be an inverter. The inverter INV2 receiving the second pre-power-up signal PRE_PWRUPB2 may use the second power supply voltage VPP, and the remaining logics INV1, INV3, INV4 and NAND may use the first power supply voltage VDD. The power-up signal PWRUPB is activated to a low level, that is, the power-up signal PWRUPB has the activation level of the ground voltage VSS. When the power-up signal PWRUPB is not activated, a node from which the power-up signal PWRUPB is generated may be driven by the first power supply voltage VDD.

The internal circuit 120 receives the first power supply voltage VDD and the second power supply voltage VPP, and when the power-up signal PWRUPB is activated, performs a predetermined operation by using the first power supply voltage VDD and the second power supply voltage VPP. The first power supply voltage VDD is inputted through the first voltage pad PAD1, and the second power supply voltage VPP is inputted through the second voltage pad PAD2.

Figure 2:
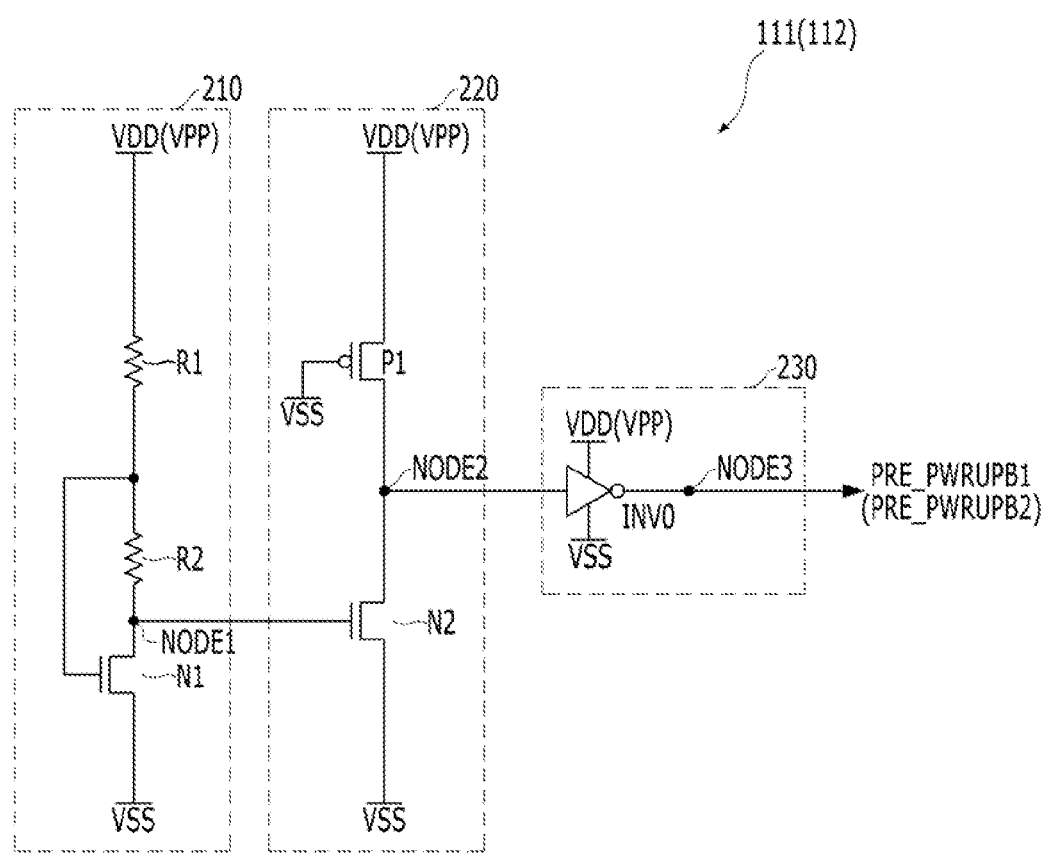
FIG. 2 is a detailed diagram illustrating a first pre-power-up signal generation block shown in FIG. 1.

FIG. 2 is a detailed diagram illustrating the first pre-power-up signal generation block 111 shown in FIG. 1.

As shown in FIG. 2, the first pre-power-up signal generation block 111 may include a level detecting unit 210, an internal node driving unit 220, and a signal driving unit 230.

The level detecting unit 210 detects the level of the first power supply voltage VDD and outputs the first power supply voltage VDD through an output node NODE1. While the voltage of the output node NODE1 rises together with the first power supply voltage VDD as the first power supply voltage VDD rises, the voltage of the output node NODE1 may fall when the first power supply voltage VDD becomes higher than the first level. The level detecting unit 210 may include a first resistor R1, a second resistor R2 and an NMOS transistor N1. The first level may be determined according to the ratio of the resistance values of the first resistor R1 and the second resistor R2. If the level of the first power supply voltage VDD becomes higher than the first level, the NMOS transistor N1 is turned on, and the output node NODE1 is pull-down driven to the ground voltage VSS.

The internal node driving unit 220 drives an internal node NODE2 with a driving force that is determined according to the level of the first power supply voltage VDD detected by the level detecting unit 210. The internal node driving unit 220 pull-up drives the internal node NODE2 as the first power supply voltage VDD rises, and pull-down drives the internal node NODE2 with a driving force that is determined according to the voltage of the output, node NODE1. The internal node driving unit 220 may include a PMOS transistor P1 and an NMOS transistor N2. The PMOS transistor P1 pull-up drives the internal node NODE2 with the first power supply voltage VDD as the first power supply voltage VDD rises. The NMOS transistor N2 pull-down drives the internal node NODE2 to the ground voltage VSS as the voltage of the internal node NODE2 rises.

The signal driving unit 230 operates using the first power supply voltage VDD, and may drive a node NODE3 from which the first pre-power-up signal PRE_PWRUPB1 is generated according to the voltage of the internal node NODE2. The signal driving unit 230 may include an inverter INV0. The signal driving unit 230 drives the node NODE3 to the first power supply voltage VDD when the voltage of the internal node NODE2 is a low level, and drives the node NODE3 to the ground voltage VSS when the voltage of the internal node NODE2 is a high level.

The second pre-power-up signal generation block 112 has the same configuration as the first pre-power-up signal generation block 111, except that the respective components of the second pre-power-up signal generation block 112 operate using not the first power supply voltage VDD but the second power supply voltage VPP.

Figure 3:
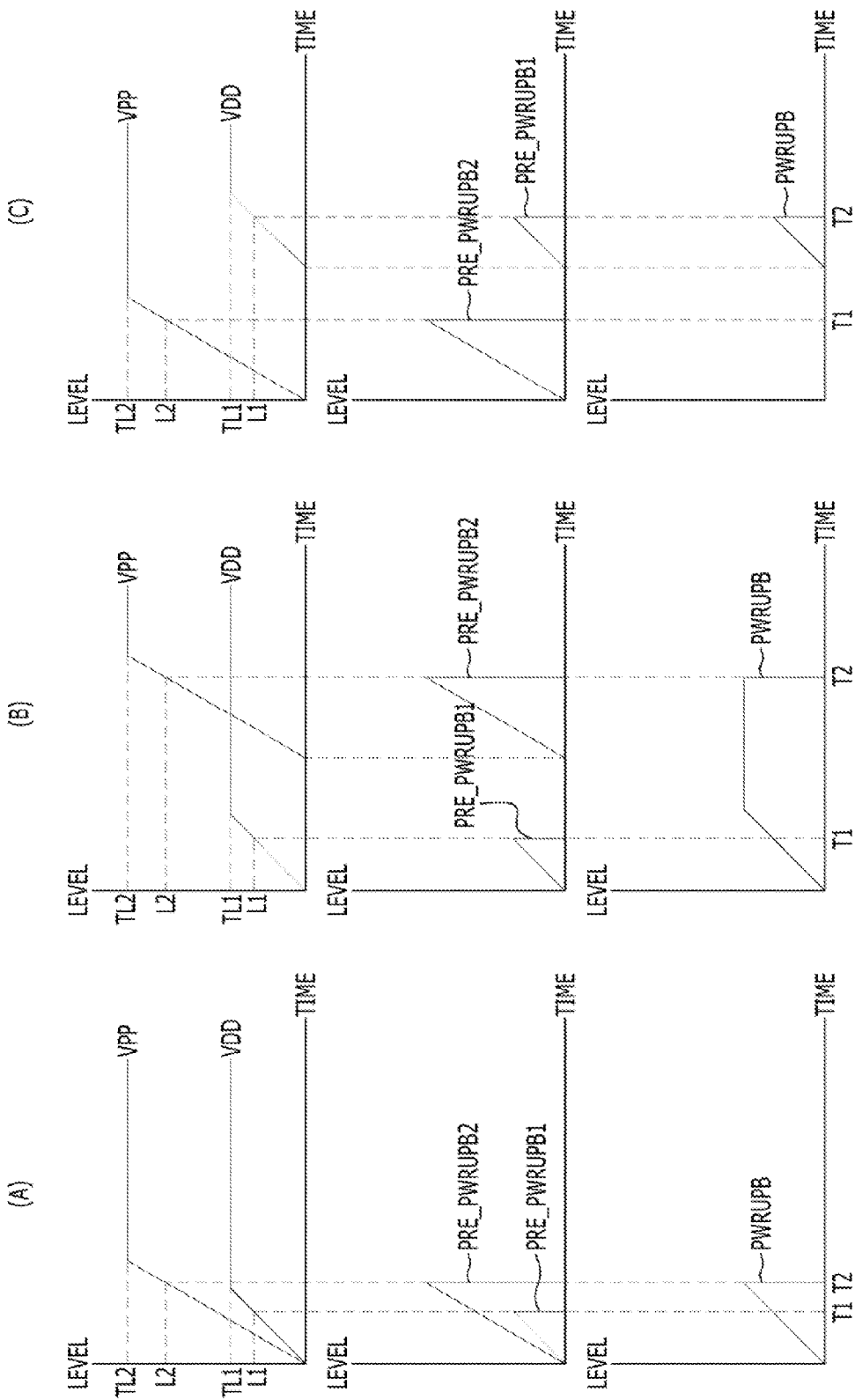
FIG. 3 is a diagram for describing an operation of the power-up signal generation circuit shown in FIG. 1.

FIG. 3 is a diagram for describing an operation of the power-up signal generation circuit 110 shown in FIG. 1. FIG. 3 illustrates relationships among the first power supply voltage VDD, the second power supply voltage VPP, the first pre-power-up signal PRE_PWRUPB1 the second pre-power-up signal PRE_PWRUPB2 and the power-up signal PWRUPB when initializing the internal circuit 120 by using the power-up signal PWRUPB.

The power-up signal generation circuit 110 will be described below with reference to FIGS. 1 to 3.

The relationships among the power supply voltages VDD and VPP and the power-up signals PRE_PWRUPB1, PRE_PWRUPB2 and PWRUPB will be described by being divided into three cases. For reference, all circuits do not operate before a power-up in which the power supply voltages VDD and VPP are not inputted, thus all the power-up signals PRE_PWRUPB1, PRE_PWRUPB2 and PWRUPB retain low level states.

In a first example (A), the first power supply voltage VDD and the second power supply voltage VPP rise simultaneously.

If the first power supply voltage VDD rises, the first pre-power-up signal PRE_PWRUPB1 rises together with the first power supply voltage VDD with a predetermined slope. If the first power supply voltage VDD becomes higher than a first level L1, the first pre-power-up signal PRE_PWRUPB1 is activated, for example, to a low level, at T1. If the second power supply voltage VPP rises, the second pre-power-up signal PRE_PWRUPB2 rises together with the second power supply voltage VPP with a predetermined slope. If the second power supply voltage VPP becomes higher than a second level L2, the second pre-power-up signal PRE_PWRUPB2 is activated, for example, to a low level at T2.

The power-up signal PWRUPB rises together with the first power supply voltage VDD with a predetermined slope. If both the first pre-power-up signal PRE_PWRUPB1 and the second pre-power-up signal PRE_PWRUPB2 are activated for example, to the low level, since both inputs to the NAND gate NAND shown in FIG. 1 become high, the power-up signal PWRUPB is activated for example, to a low level. The first power supply voltage VDD rises to a first target level TL1, and the second power supply voltage VPP rises to a second target level TL2.

In a second example (B), the first power supply voltage VDD rises first and the second power supply voltage VPP rises afterwards.

If the first power supply voltage VDD rises, the first pre-power-up signal PRE_PWRUPB1 and the power-up signal PWRUPB rise together. Thereafter, if the first power supply voltage VDD becomes higher than the first level L1, the first pre-power-up signal PRE_PWRUPB1 is activated at T1, and the power-up signal PWRUPB rises together with the first power supply voltage VDD and retains the first target level TL1. Thereafter, if the second power supply voltage VPP rises, the second pre-power-up signal PRE_PWRUPB2 rises. If the second power supply voltage VPP becomes higher than the second level L2, the second pre-power-up signal PRE_PWRUPB2 is activated at T2, and since the first and second pre-power-up signals PRE_PWRUPB1 and PRE_PWRUPB2 are activated, the power-up signal PWRUPB is activated as well.

In a third example (C), the second power supply voltage VPP rises first and the first power supply voltage VDD rises afterwards.

If the second power supply voltage VPP rises, the second pre-power-up signal PRE_PWRUPB2 rises. However, since the NAND gate NAND and the two inverters INV3 and INV4 operate using the first power supply voltage VDD, the power-up signal PWRUPB does not rise together with the second power supply voltage VPP and is retained at a low level. Thereafter, if the second power supply voltage VPP becomes higher than the second level L2, the second pre-power-up signal PRE_PWRUPB2 is activated at T1. After the power-up signal PWRUPB retains a low level state until the first power supply voltage VDD starts to rise, the power-up signal PWRUPB rises together with the first pre-power-up signal PRE_PWRUPB1 when the first power supply voltage VDD rises, and is activated together with the first pre-power-up signal PRE_PWRUPB1 when the first power supply voltage VDD becomes higher than the first level L1 at T2.

In the above descriptions, the period of time from when power starts to be inputted to the time T2 when the power-up signal PWRUPB is activated, is referred to as a ramp-up period. The ramp-up period is not a period during which the internal circuit 120 may normally operate. Therefore, during the ramp-up period, the power-up signal PWRUPB should not have a low level, but should rise together with the first power supply voltage VDD or should have a high level, to allow an initialization operation to be performed and prevent an error from occurring in the internal circuit 120.

However, in the third example (C) in which the second power supply voltage VPP rises earlier than the first power supply voltage VDD, since the power-up signal PWRUPB becomes the low level when the second power supply voltage VPP is supplied and the first power supply voltage VDD is not supplied, the internal circuit 120 performs an incomplete operation by using only the second power supply voltage VPP. Due to this fact, leakage current is likely to flow from a voltage terminal to which the second power supply voltage VPP is applied, to a voltage terminal having a low voltage.

In general, the first power supply voltage VDD is a main power supply voltage of a semiconductor device, and most elements included in the semiconductor device operate using the first power supply voltage VDD. The second power supply voltage VPP has a target voltage higher than the first power supply voltage VDD, and is used mainly for driving word lines, etc. Therefore, when the second power supply voltage VPP as a relatively high voltage is applied when the first power supply voltage VDD as a main power supply voltage is not inputted, various concerns, such as, leakage current, may result.

Figure 4:
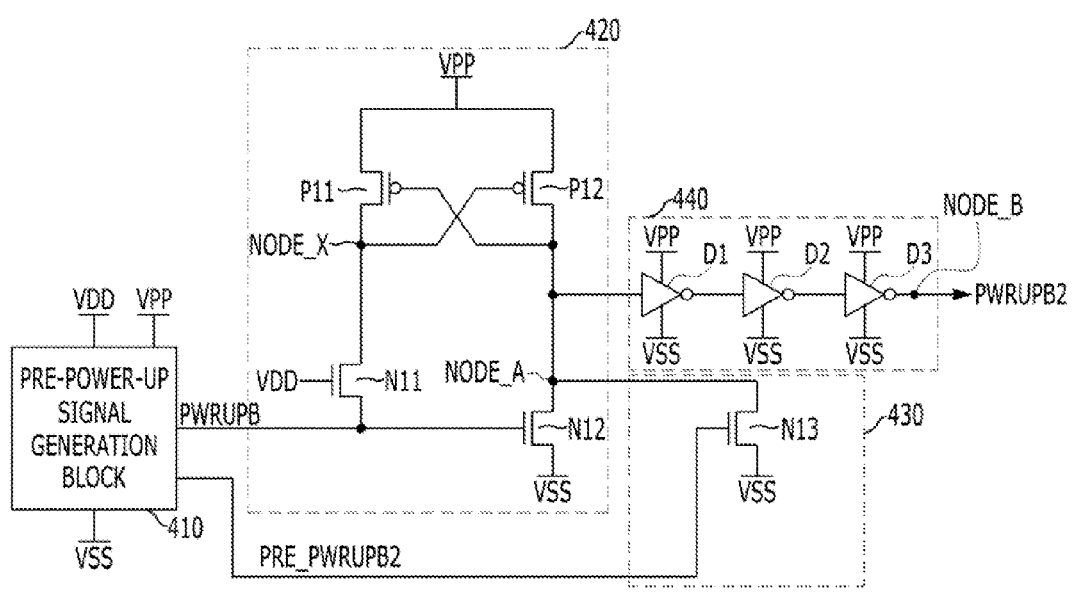
FIG. 4 is a diagram illustrating a power-up signal generation circuit in accordance with an embodiment of the present invention.

FIG. 4 is a diagram illustrating a power-up signal generation circuit in accordance with an embodiment of the present invention.

As shown in FIG. 4, the power-up signal generation circuit may include a pre-power-up signal generation block 410, a level shifting block 420, an additional driving block 430, and a power-up signal driving block 440.

The pre-power-up signal generation block 410 detects the levels of the first power supply voltage VDD and the second power supply voltage VPP, and generates pre-power-up signals PWRUPB and PRE_PWRUPB. The detailed configuration and operation of the pre-power-up signal generation block 410 are the same as the configuration and operation of the pre-power-up signal generation circuit 110 described above with reference to FIGS. 1 to 3. The pre-power-up signal PWRUPB shown in FIG. 4 corresponds to the pre-power-up signal PWRUPB shown in FIG. 1.

The level shifting block 420 pull-down drives an internal node NODE_A when the pre-power-up signal PWRUPB is not in an activated state, and pull-up drives the internal node NODE_A with the second power supply voltage VPP when the pre-power-up signal PWRUPB is in the activated state. If the first power supply voltage VDD starts to rise, in a state before a power-up, the pre-power-up signal PWRUPB starts to rise, and the level shifting block 420 pull-down drives the internal node NODE_A to the ground voltage VSS based on the pre-power-up signal PWRUPB. If the pre-power-up signal PWRUPB is in the activated state, the level shifting block 420 pull-up drives the internal node NODE_A with the second power supply voltage VPP.

The level shifting block 420 may include a plurality of transistors N11, N12, P11 and P12. The transistor N11 has one end applied with the pre-power-up signal PWRUPB and the other end connected with an internal node NODE_X and is turned on or off based on the first power supply voltage VDD. The transistor N2 has one end applied with the ground voltage VSS and the other end connected with the internal node NODE_A, and is turned on or off based on the pre-power-up signal PWRUPB. The transistor P1 has one end connected with the internal node NODE_X and the other end applied with the second power supply voltage VPP, and is turned on or off according to the voltage of the internal node NODE_A. The transistor P12 has one end connected with the internal node NODE_A and the other end applied with the second power supply voltage VPP, and is turned on or off based on the voltage of the internal node NODE_X.

The additional driving block 430 pull-down drives the internal node NODE_A when the second power supply voltage VPP is lower than a second level. The additional driving block 430 functions to drive the voltage of the internal node NODE_A to the ground voltage VSS and retain the voltage of the internal node NODE_A at a low level when the second power supply voltage VPP rises and when the first power supply voltage VDD does not rise. The additional driving block 430 may include an NMOS transistor N3, which has one end applied with the ground voltage VSS and the other end connected to the internal node NODE_A, and is turned on or off based on the second pre-power-up signal PRE_PWRUPB2. The transistor N3 is turned on when the second pre-power-up signal PRE_PWRUPB2 is not in an activated state, and drives the internal node NODE_A to the ground voltage VSS.

The power-up signal driving block 440 operates using the second power supply voltage VPP, and drives a node NODE_B from which a power-up signal PWRUPB2 is generated, based on the voltage of the internal node NODE_A. The power-up signal driving block 440 may include one or more first drivers D1, D2 and D3 which operate using the second power supply voltage VPP and are connected in series between the internal node NODE_A and the node NODE_B. The first drivers D1, D2 and D3 may be inverters, and the power-up signal driving block 440 may include an odd number of first drivers.

The node NODE_B is driven to a high level when the internal node NODE_A is at a low level, and is driven to a low level when the internal node NODE_A is at a high level. Particularly, when the second power supply voltage VPP is inputted earlier than the first power supply voltage VDD, since the voltage of the internal node NODE_A is retained at the low level by the additional driving block 430, the voltage of the node NODE_B rises according to the second power supply voltage VPP, and may be retained at a high level until' the first power supply voltage VDD becomes higher than the first level that is until the pre-power-up signal PWRUPB is activated.

For reference, the first pre-power-up signal PRE_PWRUPB1, the second pre-power-up signal PRE_PWRUPB2, the pre-power-up signal PWRUPB and the power-up signal PWRUPB2 may be signals which are activated to the low level. The first pre-power-up signal PRE_PWRUPB1 and the pre-power-up signal PWRUPB may be signals which are driven by the first power supply voltage VDD, and the second pre-power-up signal PRE_PWRUPB2 and the power-up signal PWRUPB2 may be signals which are driven by the second power supply voltage VPP.

Figure 5:
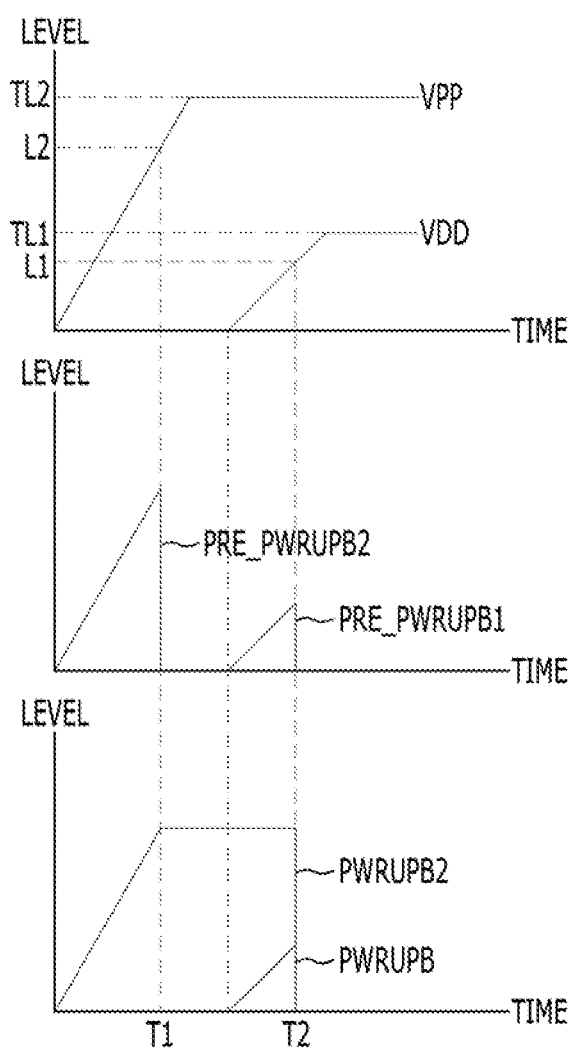
FIG. 5 is a wave form diagram of the power-up signal generation circuit shown in FIG. 4.

FIG. 5 is a wave form diagram of the power-up signal generation circuit shown in FIG. 4. FIG. 5 illustrates a relationship among the first power supply voltage VDD, the second power supply voltage VPP, the first pre-power-up signal PRE_PWRUPB1, the second pre-power-up signal PRE_PWRUPB2, the pre-power-up signal PWRUPB, and the power-up signal PWRUPB2 generated by the power-up signal generation circuit shown FIG. 4, in example (C) of FIG. 3.

The power-up signal generation circuit of FIG. 4 will be described with respect to example (C) of FIG. 3 in which a concern arises.

If the second power supply voltage VPP rises, the second pre-power-up signal PRE_PWRUPB2 rises. Since the gate NAND and the two inverters INV3 and INV4 operate using the first power supply voltage VDD, the pre-power-up signal PWRUPB does not rise together with the second power supply voltage VPP. However, since the internal node NODE_A is pull-down driven by the additional driving block 430 and the power-up signal driving block 440 operates using the second power supply voltage VPP, the power-up signal PWRUPB2 rises together with the second power supply voltage VPP. Thereafter, when the second power supply voltage VPP becomes higher than the second level L2, the second pre-power-up signal PRE_PWRUPB2 is activated at T1.

The pre-power-up signal PWRUPB retains the low level state until the first power supply voltage VDD starts to rise, rises together with the first pre-power-up signal PRE_PWRUPB1 when the first power supply voltage VDD rises, and is activated together with the first pre-power-up signal PRE_PWRUPB1 when the first power supply voltage VDD becomes higher than the first level L1. While the power-up signal PWRUPB2 rises together with the second power supply voltage VPP and retains the second target level TL2, the power-up signal PWRUPB2 is activated together with the pre-power-up signal PWRUPB when the pre-power-up signal PWRUPB is activated, as the first power supply voltage VDD becomes higher than the first level L1 at T2.

As can be seen from the descriptions given above with reference to FIGS. 4 and 5, the power-up signal generation circuit raises the power-up signal PWRUPB2 even when the second power supply voltage VPP is applied earlier than the first power supply voltage VDD as a main power supply voltage, and retains the power-up signal PWRUPB2 to the high level until the first power supply voltage VDD becomes higher than the first level, whereby it may be possible to resolve a concern, such as, leakage current occurring when initializing a semiconductor device.

Figure 6:
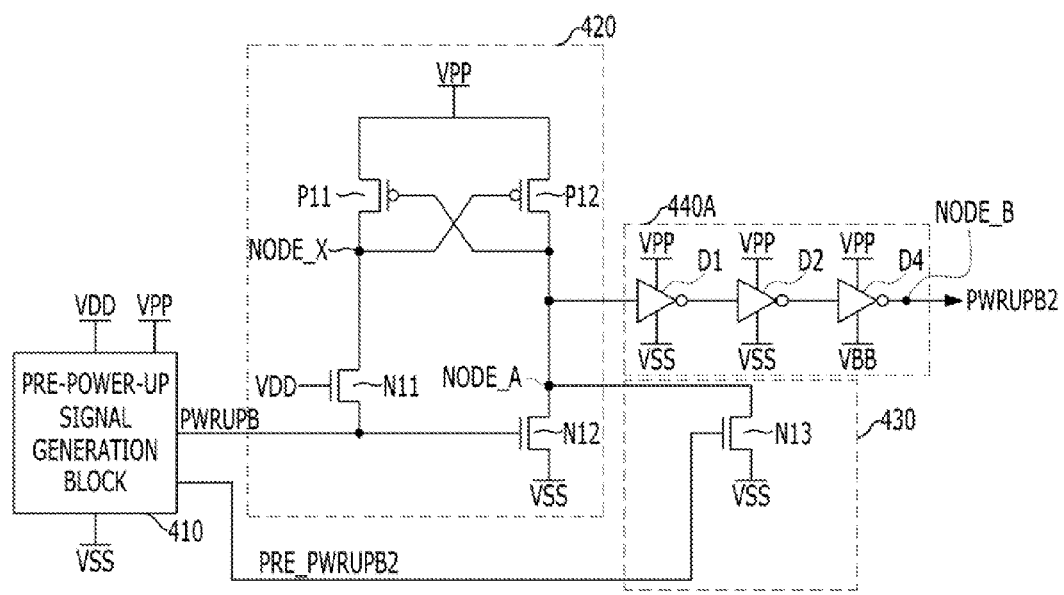
FIG. 6 is a diagram illustrating a power-up signal generation circuit in accordance with an embodiment of the present invention.

FIG. 6 is a diagram illustrating a power-up signal generation circuit in accordance with an embodiment of the present invention.

The power-up signal generation circuit generates a power-up signal PWRUPB2 used for stable initialization of a semiconductor device including a power-up signal generation circuit, which uses a negative voltage VBB lower than a ground voltage.

The configuration and operation of the power-up signal generation circuit shown in FIG. 6 are substantially the same as those of the power-up signal generation circuit shown in FIG. 4, except that the power-up signal driving block 440A includes at least one second driver D4 which operates using the second power supply voltage VPP and the negative voltage VBB. Each of the first drivers D1 and D2 and the second driver D4 included in the power-up signal driving block 440A may be inverters, and the sum of the numbers of the first drivers D1 and D2 and the second driver D4 included in the power-up signal driving block 440A may be odd.

The power-up signal PWRUPB2 generated by the power-up signal generation circuit shown in FIG. 6 may be activated to a low level, and the activation level may be a level of negative voltage VBB. For reference, the negative voltage VBB may be used as a bulk bias voltage of a cell transistor included in the memory cell of a DRAM, or to deactivate an activated word line.

Figure 7:
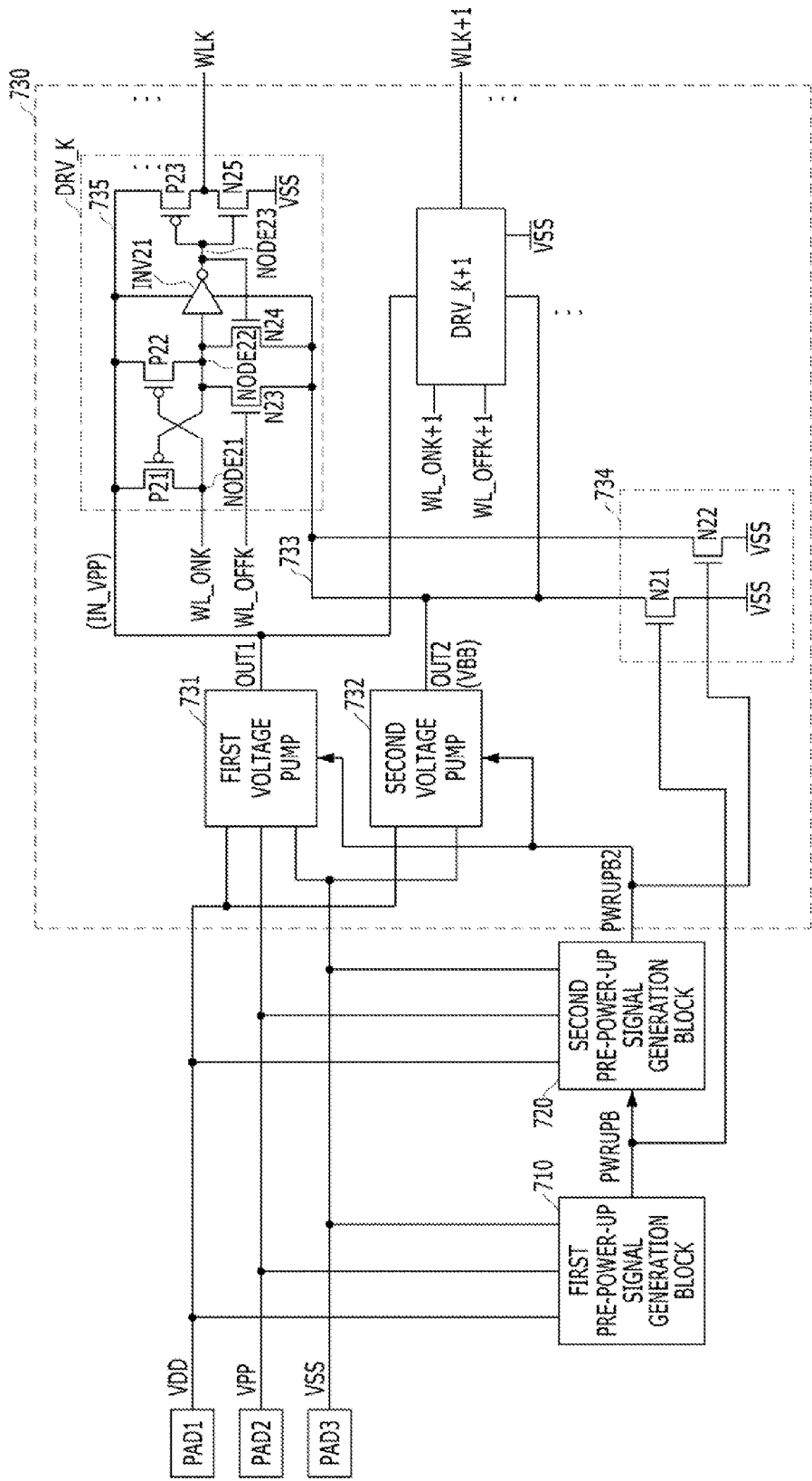
FIG. 7 is a diagram illustrating a semiconductor device in accordance with an embodiment of the present invention.

FIG. 7 is a diagram illustrating a semiconductor device accordance with an embodiment of the present invention.

As shown in FIG. 7, the semiconductor device may include a first power pad PAD1, a second power pad PAD2, a third power pad PAD3, a first power-up signal generation block 710, a second power-up signal generation block 720, and an internal circuit 730.

The first power supply voltage VDD is inputted through the first voltage pad PAD1, the second power supply voltage VPP is inputted through the second voltage pad PAD2, and the ground voltage VSS is applied through the third voltage pad PAD3. The semiconductor device receives the first power supply voltage VDD, the second power supply voltage VPP and the ground voltage VSS through the first to third voltage pads PAD1 to PAD3, respectively, from an exterior.

The configuration and operation of the first power-up signal generation block 710 are the same as those of the power-up signal generation circuit 110 shown in FIG. 1. A first power-up signal PWRUPB may correspond to the power-up signal PWRUPB shown in FIG. 1. The second power-up signal generation block 720 may include the level shifting block 420, the additional driving block 430 and the power-up signal driving block 440 shown in FIG. 4. A second power-up signal PWRUPB2 may correspond to the power-up signal PWRUPB2 shown in FIG. 4. Alternatively, the second power-up signal generation block 720 may include the level shifting block 420, the additional driving block 430 and the power-up signal driving block 440A shown in FIG. 6. The second power-up signal PWRUPB2 may correspond to the power-up signal PWRUPB2 shown in FIG. 6.

The internal circuit 730 operates using the first power supply voltage VDD and the second power supply voltage VPP, and may be initialized based on the first power-up signal PWRUPB and the second power-up signal PWRUPB2. The internal circuit 730 may include a plurality of sub-circuits, and the sub-circuits may be initialized based on at least one power-up signal of the first power-up signal PWRUPB and the second power-up signal PWRUPB2. Particularly, a circuit, which a concern may be caused when the second power supply voltage VPP rises first and the first power supply voltage VDD rises afterwards, may be initialized based on the second power-up signal PWRUPB2. Hereafter, descriptions will be made as an example of a circuit which is initialized based on the second power-up signal PWRUPB2.

The internal circuit 730 may include one or more word lines WLK and WLK+1, a first voltage pump 731, a second voltage pump 732, one or more word line driving blocks DRV_K and DRV_K+1, a negative voltage line 733, a voltage line initialization block 734, and a pumping voltage line 735. One or more memory cells (not shown) may be connected to each of the word lines WLK and WLK+1.

The first voltage pump 731 receives the first power supply voltage VDD and the second power supply voltage VPP, performs a charge pumping operation, outputs a pumping voltage IN_VPP which has a third target level higher than a first target level, to an output node OUT1, and blocks the second power supply voltage VPP from being transferred to the output node OUT1 when the second power-up signal PWRUPB2 is in a deactivated state. The output node OUT1 is connected with the pumping voltage line 735, and the pumping voltage IN_VPP generated by the first voltage pump 731 may be transferred to the word line driving blocks DRV_K and DRV_K+1 through the pumping voltage line 735.

The second voltage pump 732 receives the first power supply voltage VDD or the second power supply voltage VPP and the ground voltage VSS, performs a charge pumping operation, and outputs a negative voltage VBB to an output node OUT2. The output node OUT2 is connected with the negative voltage line 733, and the negative voltage VBB generated by the second voltage pump 732 may be transferred to the one or more word line driving blocks DRV_K and DRV_K+1 through the negative voltage line 733.

The voltage line initialization block 734 may drive the negative voltage line 733 to the ground voltage VSS when at least one signal of the first power-up signal PWRUPB and the second power-up signal PWRUPB2 is in a deactivated state. The voltage line initialization block 734 may include an NMOS transistor N21, which has one end applied with the ground voltage VSS and the other end connected to the negative voltage line 733, and is turned on or off based on the first power-up signal PWRUPB, and an NMOS transistor N22, which has one end applied with the ground voltage VSS and the other end connected to the negative voltage line 733, and is turned on or off based on the second power-up signal PWRUPB2.

Each of the word line driving blocks DRV_K and DRV_K+1 activates a corresponding word line when the corresponding word line is selected in an activating operation, and deactivates the corresponding word line when activation is completed. Each of the word line driving blocks DRV_K and DRV_K+1 may perform operations for activating and deactivating a word line, by using the pumping voltage IN_VPP and the negative voltage VBB. The word line driving block DRV_K corresponds to the word line WLK, and the word line driving block DRV_K+1 corresponds to the word line WLK+1. The configurations and operations of the word line driving blocks DRV_K and DRV_K+1 are the same, except that corresponding word lines are different.

The word line driving block DRV_K drives the corresponding word line WLK with the pumping voltage IN_VPP when a corresponding word line on signal WL_ONK is activated. The word line on signal WL_ONK may be activated when the word line WLK is selected by an address inputted to the semiconductor device in an activating operation. Additionally, the word line driving block DRV_K drives the corresponding word line WLK to the ground voltage VSS when a corresponding word line off signal WL_OFFK is activated. The word line off signal WL_OFFK may be activated to deactivate the word line WLK in a precharge operation, with the word line WLK activated. For these operations the word line driving block DRV_K may include a plurality of transistors N23 to N25 and P21 to P23 and an inverter INV21. The inverter INV21 may operate using the pumping voltage IN_VPP and the negative voltage VBB.

If the word line WLK is designated by a row address in the activating operation, since the word line on signal WL_ONK is activated for example, to a low level, and the voltage of a node NODE21 becomes a low level, a node NODE22 is pull-up driven with the pumping voltage IN_VPP by the transistor P22 which is turned on. The inverter INV21 pull-down drives a node NODE23 to the negative voltage VBB based on the voltage of the node NODE22, and the word line WLK is finally pull-up driven, that is, activated, by the transistor P23.

In a deactivating operation, the word line off signal WL_OFFK is activated, for example, to a high level, thus, the transistor N23 is turned on. The node NODE22 is pull-down driven to the negative voltage VBB, the inverter INV21 pull-up drives the node NODE23 with the pumping voltage IN_VPP in response to the voltage of the node NODE22, and the word line WLK is finally pull-down driven that is, deactivated, by the transistor N25. The configuration and operation of the word line driving block DRV_K+1 may be the same as the word line driving block DRV_K, except that the corresponding word line is different.

The voltage line initialization block 734 may include the transistor N21 which has one end applied with the ground voltage VSS and the other end connected to the negative voltage line 713 and is turned on or off in response to the first power-up signal PWRUPB, and the transistor N22 which has one end applied with the ground voltage VSS and the other end connected to the negative voltage line 733 and is turned on or off in response to the second power-up signal PWRUPB2. The voltage line initialization block 734 pull-down drives the negative voltage line 733 to the ground voltage VSS until both the first and second power-up signals PWRUPB and PWRUPB2 are activated, in a power-up operation.

When the power-up operation of the semiconductor device is started, the first power supply voltage VDD and the second power supply voltage VPP are inputted to the power pads PAD1 and PAD2, respectively. The first and second voltage pumps 731 and 732, respectively supply the second power supply voltage VPP and the negative voltage VBB to the word line driving blocks DRV_K and DRV_K+1 when the second power-up signal PWRUPB2 is activated as the supply of power is completed. When the first voltage pump 731 does not block the second power supply voltage VPP under the control of the second power-up signal PWRUPB2 during a ramp-up period, the second power supply voltage VPP may be transferred to the pumping voltage line 735 through the output node OUT1 and the voltage of the pumping voltage line 735 may rise. Due to this fact, the leakage current may occur between the pumping voltage line 735 and the negative voltage line 733.

The voltage line initialization block 734 pull-down drives the negative voltage line 733 to the ground voltage VSS until both the first and second power-up signals PWRUPB and PWRUPB2 are activated. When the negative voltage line 733 is not pull-down driven to the ground voltage VSS under the control of the second power-up signal PWRUPB2 during the ramp-up period, the voltage of the negative voltage line 733 may be raised due to the leakage current occurring by a rise in the voltage of the pumping voltage line 735, thus a concern, such as, an additional leakage current or an operation error may be caused.

The activation level of the second power-up signal PWRUPB2 may be the level of the ground voltage VSS or the level of the negative voltage VBB. When the activation level of the second power-up signal PWRUPB2 is the level of the negative voltage VBB, it may be possible to effectively block the ground voltage VSS applied to one end of the transistor N22 after the second power-up signal PWRUPB2 is activated, from being transferred to the negative voltage line 733.

As aforementioned with reference to FIG. 5, the power-up signal generation circuit raises the second power-up signal PWRUPB2 even when the second power supply voltage VPP is applied earlier than the first power supply voltage VDD as a main power supply voltage, and retains the second power-up signal PWRUPB2 at the high level until the first power supply voltage VDD becomes higher than the first level, whereby it may be possible to resolve a concern, such as, the leakage current occurring when initializing a semiconductor device.

According to the embodiments of the present invention, in the power-up signal generation circuit and the semiconductor device including the same when the semiconductor device operates using two or more power supply voltages, the semiconductor device may be stably initialized regardless of the order in which the levels of the two or more power supply voltages rise, by initializing the semiconductor device using an added power-up signal.

Although various embodiments have been described for illustrative purposes, it will be apparent to those skilled in the art that various changes and modifications may be made without departing from the spirit and scope of the invention as defined in the following claims.

What is claimed is:

1. A power-up signal generation circuit comprising:
    a first pre-power-up signal generation block configured to operate by using a first power supply voltage having a first target level, and detect a level of the first power supply voltage to generate a first pre-power-up signal that is activated when the level of the first power supply voltage becomes higher than the first level;
    a second pre-power-up signal generation block configured to operate by using a second power supply voltage having a second target level that is higher than the first target level, and detect a level of the second power supply voltage to generate a second pre-power-up signal that is activated when the level of the second power supply voltage becomes higher than the second level;
    a signal combination block configured to operate by using the first power supply voltage, and activate a third pre-power-up signal when the first pre-power-up signal and the second pre-power-up signal are activated;
    a level shifting block configured to pull-down drive a first node when the third pre-power-up signal is not in an activated state, and pull-up drive the first node with the second power supply voltage when the third pre-power-up signal is in the activated state;
    an additional driving block configured to pull-down drive the first node in response to the second pre-power-up signal, and retain, when the second power supply voltage is applied earlier than the first power supply voltage, a voltage level of the first node after the second pre-power-up signal is activated until the first pre-power-up signal is activated; and
    a power-up signal driving block configured to operate by using the second power supply voltage, and generate a power-up signal through a second node by driving the second node based on a voltage level of the first node.

2. The power-up signal generation circuit according to claim 1, wherein the additional driving block comprises:
    a transistor having one end connected to the first node and the other end applied with a voltage for pull-down driving, and configured to be turned on or off based on the second pre-power-up signal.

3. The power-up signal generation circuit according to claim 1, wherein the first pre-power-up signal, the second pre-power-up signal, the third pre-power-up signal and the power-up signal are activated to a low level, the first pre-power-up signal and the third pre-power-up signal are driven by the first power supply voltage, and the second pre-power-up signal and the power-up signal are driven by the second power supply voltage.

4. The power-up signal generation circuit according to claim 1, wherein the power-up signal driving block operates using the second power supply voltage, and includes one or more first drivers which are connected in series between the first node and the second node.

5. The power-up signal generation circuit according to claim 1, wherein the first pre-power-up signal, the second pre-power-up signal, the third pre-power-up signal and the power-up signal have a low level before a power-up.

6. A power-up signal generation circuit comprising:
    a first pre-power-up signal generation block configured to operate by using a first power supply voltage having a first target level, and detect a level of the first power supply voltage to generate a first pre-power-up signal that is activated when the level of the first power supply voltage becomes higher than the first level;
    a second pre-power-up signal generation block configured to operate by using a second power supply voltage having a second target level that is higher than the first target level, and detect a level of the second power supply voltage to generate a second pre-power-up signal that is activated when the level of the second power supply voltage becomes higher than the second level; and
    a signal combination block configured to operate by using the first power supply voltage, and activate a third pre-power-up signal when the first pre-power-up signal and the second pre-power-up signal are activated;
    a level shifting block configured to pull-down drive a first node when the third pre-power-up signal is not in an activated state, and pull-up drive the first node with the second power supply voltage when the third pre-power-up signal is in the activated state;
    an additional driving block configured to pull-down drive the first node in response to the second pre-power-up signal, and retain, when the second power supply voltage is applied earlier than the first power supply voltage, a voltage level of the first node after the second pre-power-up signal is activated until the first pre-power-up signal is activated; and
    a power-up signal driving block configured to operate by using the second power supply voltage, and generate a power-up signal through a second node by driving the second node based on a voltage level of the first node, wherein, when the voltage of the first node is a high level, the power-up signal driving block drives the second node with a negative voltage lower than a ground voltage.

7. The power-up signal generation circuit according to claim 6, wherein the first pre-power-up signal, the second pre-power-up signal, the third pre-power-up signal and the power-up signal are activated to a low level, the first pre-power-up signal and the third pre-power-up signal are driven by the first power supply voltage, the second pre-power-up signal and the power-up signal are driven by the second power supply voltage, and an activation level of the power-up signal is a level of the negative voltage.

8. The power-up signal generation circuit according to claim 6, wherein the power-up signal driving block comprises:
    one or more first drivers operating by using the second power supply voltage; and
    at least one second driver operating by using the second power supply voltage and the negative voltage,
    wherein the one or more first drivers and at least one second driver are connected in series between the first node and the second node, and the second node is connected to an output of the second driver.

9. The power-up signal generation circuit according to claim 6, wherein the first pre-power-up signal, the second pre-power-up signal, the third pre-power-up signal and the power-up signal have a low level before a power-up.

\* \* \* \* \*